United States Patent
Li et al.

(10) Patent No.: US 10,332,919 B2
(45) Date of Patent: Jun. 25, 2019

(54) ORGANIC LIGHT-EMITTING DIODE (OLED) ARRAY SUBSTRATE AND MANUFACTURING METHOD THEREOF AND DISPLAY DEVICE

(71) Applicant: BOE Technology Group Co., Ltd., Beijing (CN)

(72) Inventors: Quanhu Li, Beijing (CN); Ling Wang, Beijing (CN); Yongqian Li, Beijing (CN); Song Meng, Beijing (CN); Yue Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/744,993

(22) PCT Filed: Jul. 17, 2017

(86) PCT No.: PCT/CN2017/093162
§ 371 (c)(1),
(2) Date: Jan. 15, 2018

(87) PCT Pub. No.: WO2018/054149
PCT Pub. Date: Mar. 29, 2018

(65) Prior Publication Data
US 2019/0013339 A1    Jan. 10, 2019

(30) Foreign Application Priority Data

Sep. 23, 2016    (CN) .......................... 2016 1 0848552

(51) Int. Cl.
*H01L 27/12*    (2006.01)
*H01L 27/32*    (2006.01)
(Continued)

(52) U.S. Cl.
CPC ....... *H01L 27/1251* (2013.01); *G09G 3/3266* (2013.01); *G09G 3/3275* (2013.01);
(Continued)

(58) Field of Classification Search
CPC . H01L 27/1251; H01L 51/56; H01L 51/5012; H01L 27/3276; H01L 27/124;
(Continued)

(56) References Cited

U.S. PATENT DOCUMENTS

2005/0258745 A1    11/2005  Tsujimura et al.
2015/0070556 A1*    3/2015  Joei ................... H01L 27/14643
                                                                348/311
2015/0379923 A1*   12/2015  Lee ....................... G09G 3/3233
                                                                345/206

FOREIGN PATENT DOCUMENTS

CN    1496196 A    5/2004
CN    103199096 A  7/2013
CN    103839915 A  6/2014

OTHER PUBLICATIONS

Oct. 11, 2017—(WO) International Search Report and Written Opinion application PCT/CN2017/093162 with English Translation.

* cited by examiner

*Primary Examiner* — Fernando L Toledo
*Assistant Examiner* — Adam S Bowen
(74) *Attorney, Agent, or Firm* — Banner & Witcoff, Ltd.

(57) ABSTRACT

An organic light-emitting diode array substrate and a manufacturing method thereof and a display device are provided. The OLED array substrate includes a base substrate, a power line and a pixel structure disposed on the base substrate. The power line is disposed under the pixel structure and is at least partially overlapped with the pixel structure; an insulating layer is disposed between the power line and the pixel
(Continued)

structure, and a first via hole structure is disposed in the insulating layer; and the power line is connected with a driving transistor in the pixel structure through the first via hole structure.

19 Claims, 4 Drawing Sheets (51) Int. Cl.

| | |
|---|---|
| *H01L 51/52* | (2006.01) |
| *H01L 51/56* | (2006.01) |
| *H01L 51/50* | (2006.01) |
| *G09G 3/3266* | (2016.01) |
| *G09G 3/3275* | (2016.01) |
| *H01L 21/77* | (2017.01) |
| *H01L 23/50* | (2006.01) |
| *H01L 27/02* | (2006.01) |

(52) U.S. Cl.
CPC .............. *H01L 21/77* (2013.01); *H01L 23/50* (2013.01); *H01L 27/02* (2013.01); *H01L 27/124* (2013.01); *H01L 27/1262* (2013.01); *H01L 27/32* (2013.01); *H01L 27/3213* (2013.01); *H01L 27/3246* (2013.01); *H01L 27/3276* (2013.01); *H01L 51/5012* (2013.01); *H01L 51/5206* (2013.01); *H01L 51/5221* (2013.01); *H01L 51/56* (2013.01)

(58) Field of Classification Search
CPC .............. H01L 51/5221; H01L 51/5206; H01L 27/3213; H01L 27/3246; H01L 27/1262; G09G 3/3266; G09G 3/3275
USPC .......................................................... 257/40
See application file for complete search history.

ORGANIC LIGHT-EMITTING DIODE (OLED) ARRAY SUBSTRATE AND MANUFACTURING METHOD THEREOF AND DISPLAY DEVICE

The application is a U.S. National Phase Entry of International Application No. PCT/CN2017/093162 filed on Jul. 17, 2017, designating the United States of America and claiming priority to Chinese Patent Application No. 201610848552.7, filed on Sep. 23, 2016. The present application claims priority to and the benefit of the above-identified applications and the above-identified applications are incorporated by reference herein in their entirety.

TECHNICAL FIELD

Embodiments of the present disclosure relate to an organic light-emitting diode (OLED) array substrate and a manufacturing method thereof and to a display device.

BACKGROUND

An organic light-emitting diode (OLED) is a kind of device using electrically excited fluorescence or phosphor organic compounds to emit light. Organic light-emitting diodes (OLEDs) are considered to have a broad application prospect because of advantages such as self-illumination, all solid state, broad view angle, rapid response speed and the like. Organic light-emitting diodes have been widely applied in cellphones, digital cameras, personal digital assistant (PDA), and laptop computers.

Nowadays, one mainstream display mode of organic light-emitting diode display (OLED) devices are in the structure having oxide thin film transistors (oxide TFTs), white OLED (WOLED) display, and color filters prepared on an array substrate (Color Filter on Array, COA). In order to solve the problem of threshold voltage (Vth) drift and luminance nonuniformity, a 3T1C external compensation technology is usually applied in the above mainstream display mode for driving pixels, and here the phrase "3T1C" means that a pixel circuit comprises three thin film transistors (T) and one storage capacitor (C). However, the pixel opening area of the organic electroluminescence device is quite small, leading to a reduced aperture ratio, so the luminescence intensity of the OLED has to be increased to compensate the disadvantages caused by the reduced aperture ratio. As a result, the lifetime of the OLED device is affected.

SUMMARY

At least one embodiment of the present disclosure provides an organic light-emitting diode (OLED) array substrate, and the OLED array substrate comprises: a base substrate; a power line and a pixel structure disposed on the base substrate. The power line is disposed under the pixel structure and is at least partially overlapped with the pixel structure. An insulating layer is disposed between the power line and the pixel structure, and a first via hole structure is disposed in the insulating layer. The power line is connected with a driving transistor in the pixel structure through the first via hole structure.

For example, in the OLED array substrate provided by at least one embodiment of the present disclosure, the driving transistor is a top-gate thin-film transistor, and the power line is overlapped with an active layer of the top-gate thin-film transistor to shield the active layer from light irradiation.

For example, in the OLED array substrate provided by at least one embodiment of the present disclosure, the power line is in a planar structure made of metal mesh.

For example, in the OLED array substrate provided by at least one embodiment of the present disclosure, each column of the pixel structures correspond to one power line of the planar structure.

For example, in the OLED array substrate provided by at least one embodiment of the present disclosure, the OLED array substrate further comprises a gate line and a data line disposed on the base substrate. The pixel structure is disposed within an area defined by an intersection of the gate line and the data line. The power line is disposed with a hollow structure within an area of the power line that corresponds to the pixel structure, the gate line and the data line.

For example, in the OLED array substrate provided by at least one embodiment of the present disclosure, the hollow structure comprises a plurality of disconnected hollow sub-structures.

For example, in the OLED array substrate provided by at least one embodiment of the present disclosure, the driving transistor is a bottom-gate thin-film transistor, and the power line is disposed between a gate metal layer of the bottom-gate thin-film transistor and the base substrate.

At least one embodiment of the present disclosure further provides a display device, comprising any one of the above organic light-emitting diode (OLED) array substrates.

At least one embodiment of the present disclosure further provides a manufacturing method of an organic light-emitting diode (OLED) array substrate, comprising: providing a base substrate; forming a power line and a pixel structure on the base substrate; and forming an insulating layer between the power line and the pixel structure and a first via hole in the insulating layer. The power line is disposed under the pixel structure and is at least partially overlapped with the pixel structure; and the power line is connected with a driving transistor in the pixel structure through the first via hole structure.

For example, in the manufacturing method provided by at least one embodiment of the present disclosure, the driving transistor is a top-gate thin-film transistor, and the power line is overlapped with an active layer of the top-gate thin-film transistor to shield the active layer from light irradiation.

For example, in the manufacturing method provided by at least one embodiment of the present disclosure, the power line is in a planar structure made of metal mesh.

For example, in the manufacturing method provided by at least one embodiment of the present disclosure, each column of the pixel structures correspond to one power line of the planar structure.

For example, in the manufacturing method provided by at least one embodiment of the present disclosure, the manufacturing method further comprises forming a gate line and a data line on the base substrate. The pixel structure is disposed within an area defined by an intersection of the gate line and the data line; the power line is disposed with a hollow structure within an area of the power line that corresponds to the pixel structure, the gate line and the data line.

For example, in the manufacturing method provided by at least one embodiment of the present disclosure, the hollow structure comprises a plurality of disconnected hollow sub-structures.

For example, in the manufacturing method provided by at least one embodiment of the present disclosure, the driving transistor is a bottom-gate thin-film transistor, and the power line is disposed between a gate metal layer of the bottom-gate thin-film transistor and the base substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Sizes of the patterns of the OLED array substrates provided by the embodiments of the present disclosure are usually in a micron scale or less. For the purpose of clarity, sizes of the structures in the drawings of the embodiments are all enlarged. Unless otherwise explained, sizes of the structures in the drawings of the embodiments are not real sizes and are not in a real scale.

Research discovers that in the structure of a present OLED array substrate, a power line (OVDD) occupies part of the opening area and the capacitor area of a pixel. In addition, the OVDD line has certain resistance itself, and when a current runs through the OVDD line, the voltage drop over the OVDD line will affect the light-emitting current, which causes fluctuation of the amplitude of the OVDD signal. Considering characteristics of a thin-film transistor (TFT) are not ideal (the saturation current is related to Vgs as well as Vds) and the voltage drop over the OVDD line will affect Vds, the output currents of OLED sub-pixels in different positions will change due to the changes of the OVDD voltage. So the resistance of the OVDD line needs to be reduced to the greatest extent to reduce the voltage drop of the OVDD line.

At least one embodiment of the present disclosure provides an organic light-emitting diode (OLED) array substrate, and the organic light-emitting diode (OLED) array substrate comprises a base substrate, and a power line and a pixel structure disposed on the base substrate. The power line is disposed under the pixel structure and is at least partially overlapped with the pixel structure. An insulating layer is disposed between the power line and the pixel structure, and a first via hole structure is disposed in the insulating layer. The power line is connected with a driving transistor in the pixel structure through the first via hole structure.

In the organic light-emitting diode (OLED) array substrate, by setting the power line under the pixel structure and at least partially overlapped with the pixel structure, and also by setting the power line connected with a driving transistor in the pixel structure through the first via hole structure disposed in the insulating layer, it is avoided that the OVDD line occupies the opening area and the capacitor area of the pixel, and therefore the aperture ratio of the pixel area is increased and the resistance between the pixel and the OVDD line in the display area is reduced.

Figure 1:
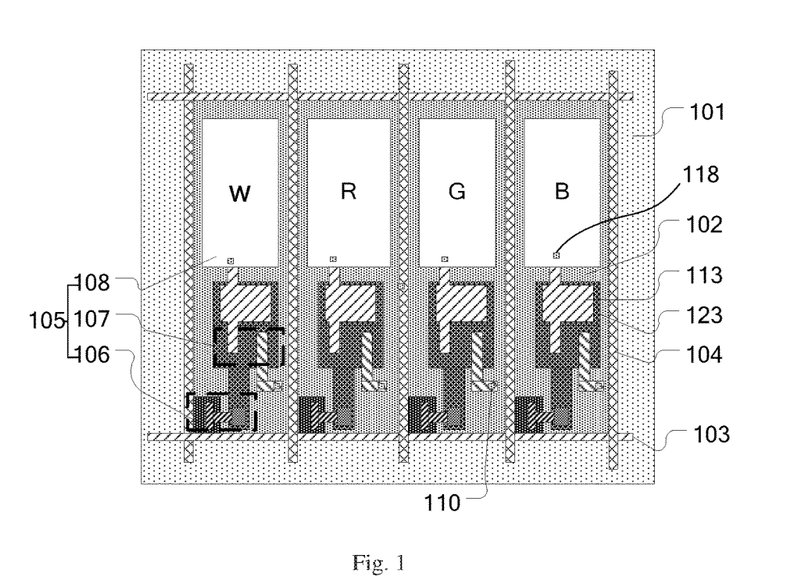
FIG. 1 is a schematic plan view of an organic light-emitting diode (OLED) array substrate provided by an embodiment of the present disclosure.

An embodiment of the present disclosure provides an organic light-emitting diode (OLED) array substrate, and FIG. 1 is a schematic plan view of an organic light-emitting diode (OLED) array substrate provided by the embodiment of the present disclosure. As illustrated in FIG. 1, the organic light-emitting diode (OLED) array substrate comprises a base substrate 101, and a power line 102 and a pixel structure 105 that are disposed on the base substrate 101. The power line 102 is disposed under the pixel structure 105 and is at least partially overlapped with the pixel structure 105. An insulating layer (not shown in FIG. 1) is disposed between the power line 102 and the pixel structure 105, and a first via hole structure 110 is formed in the insulating layer. The power line 102 is connected with a driving transistor 107 in the pixel structure 105 through the first via hole structure 110.

For example, as illustrated in FIG. 1, a gate line 103 and a data line 104 are further disposed on the base substrate 101, and the pixel structure 105 is disposed within an area defined by an intersection of the gate line 103 and the data line 104. The pixel structure 105 comprises a switch transistor 106, a driving transistor 107 and an OLED device 108. The switch transistor 106 is connected to the gate line 103 and the data line 104. The driving transistor 107 is connected to the switch transistor 106, the power line 102 and the OLED device 108. The position of the switch transistor 106 and the driving transistor 107 can be referred to the corresponding dashed box.

Although FIG. 1 only illustrates four paratactic pixel structures, which emit white (W) light, red (R) light, green (G) light and blue (B) light respectively. However, those skilled in the art should understand the number of the pixel structures comprised by the array substrate provided by the embodiment of the present disclosure is not limit to four and it can be more.

Each pixel structure further comprises a storage capacitor, and the storage capacitor comprises a first electrode 113 and a second electrode 123 which are opposite to each other. As illustrated in FIG. 1, the first electrode 113 and the second electrode 123 are in a block shape and a dielectric layer made of an insulating material is disposed between the first electrode 113 and the second electrode 123. For example, the first electrode 113 is connected with the drain of the driving transistor 107, and the second electrode 123 is connected with the drain of the switch transistor 106.

For example, the OLED array substrate comprises a display area and a peripheral area outside the display area. The display area is also called as AA (active area) area and is for performing display. The peripheral area can be used for disposing driving circuits and encapsulating the display panel. The above pixel structure, the gate line and the data line are all disposed in the display area. For example, in addition to the conductive lines such as the gate line, the data line, the OLED array substrate can further comprise a detection compensation line that connects the pixel unit and the detection integrated circuit, and the detection compensation line can also be disposed in the display area.

For example, considering the area where the gate line is located is close to the area where the driving transistor and the storage capacitor are located, the power line can be formed in a wider area so as to allow the power line to be overlapped with the area where the driving transistor is located and the area where the storage capacitor is located in a direction that is perpendicular to the OLED array substrate. A traverse large power line area can be formed corresponding to the area where the gate line, the driving transistor and the storage capacitor are located. For example, the power line is in a planar electrode structure made of metal mesh (rather than a single strip or line), and the power line in the planar structure made of metal mesh can comprise a plurality of mesh openings. The power line in the planar structure can reduce the voltage drop (IR drop) of the power line so as to reduce the power consumption of the OLED array substrate. It should be noted that the power line in the planar structure means the power line has a certain size and an extension region both in the width direction and the length direction of the pixel stricture.

For example, in one example, each column of pixel structures can be disposed with a planar power line correspondingly, so planar power lines can be further connected to form an integrated structure. In this way, the area of the power line can be larger so that the voltage drop (IR drop) of the power line can be further reduced and the power consumption of the OLED array substrate can be further reduced.

Figure 2:
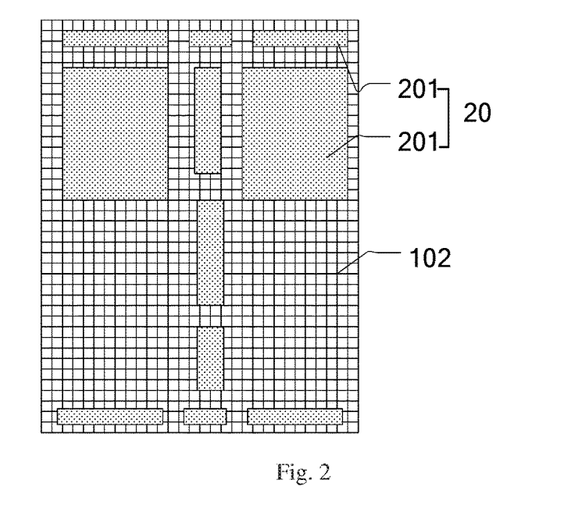
FIG. 2 is a plan schematic view of a power line that is provided with a hollow structure provided by an embodiment of the present disclosure.

For example, in one example, the planar power line can be formed with a hollow structure within an area of the power line that corresponds to the pixel structure, the gate line and the data line. It should be noted that the size of the hollow structure correspond to the size of the pixel structure, the gate line and the data line. The size of the hollow structure is larger than the size of the aforesaid mesh. For example, FIG. 2 is a plan schematic view of a power line that is formed with a hollow structure provided by an embodiment of the present disclosure. As illustrated in FIG. 2, the area that the power line 102 corresponds to the pixel structure is disposed with a hollow structure 20 so as to prevent this metal wire from shielding light and affecting light transmittance, that is, forming the hollow structure in the area corresponding to the pixel structure can improve the light transmittance and make a full use of incident light. The area of the power line 102 corresponding to the gate line and the data line is provided with the hollow structure so as to avoid producing capacitance between the power line and the gate line or the data line. For example, as illustrated in FIG. 2, the hollow structure 20 can comprise a plurality of disconnected hollow sub-structures 201 (i.e., hollow sub-structures that are separate from each other). This means dividing the planar power line into a plurality of parallel-connected portions and can reduce the resistance of the planar power line and reduce the voltage drop of the power line to a large extent.

For example, the driving transistor can be a bottom-gate thin-film transistor or a top-gate thin-film transistor. When the driving transistor is a top-gate thin-film transistor, the power line can be overlapped with the active layer of the top-gate thin-film transistor to shield the active layer from light irradiation for example. When the driving transistor is a bottom-gate thin-film transistor, the power line can be disposed between the gate metal layer of the bottom-gate thin-film transistor and the base substrate and can be overlapped with the active layer, for example.

Descriptions are given below taking the driving transistor as a top-gate thin-film transistor and a bottom-gate thin-film transistor for example respectively.

The first example is that the driving transistor is a top-gate thin-film transistor and the power line is overlapped with the active layer of the top-gate transistor to shield the active layer from light.

Figure 3:
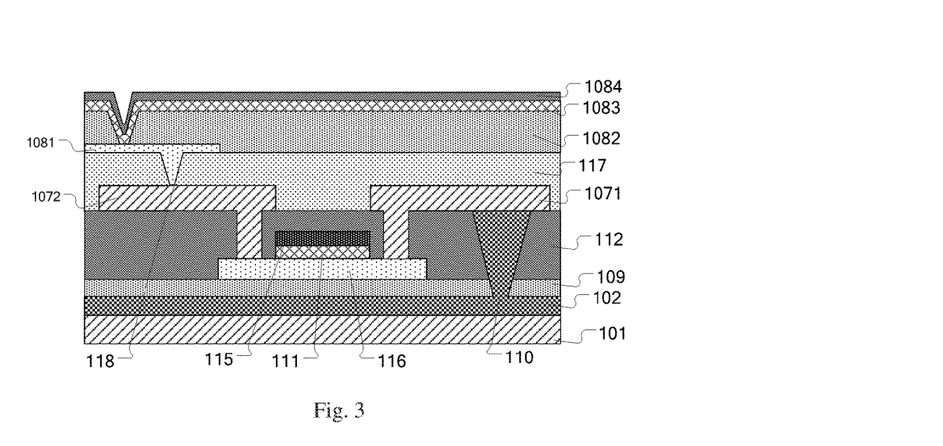
FIG. 3 is a schematic partial sectional view of an organic light-emitting diode (OLED) array substrate provided by an embodiment of the present disclosure.

For example, FIG. 3 is a schematic sectional view of a part of an organic light-emitting diode (OLED) array substrate provided by an embodiment of the present disclosure. For example, as illustrated in FIG. 3, the driving transistor is a top-gate thin-film transistor. It can be seen from FIG. 1 and FIG. 3 that the power line 102, the switch transistor (not shown in FIG. 3), the driving transistor and the OLED device are disposed on the base substrate 101. The power line 102 is far away in distance from the gate line 103 and the data line 104 so as to reduce the mutual interference between the gate line 103 and the power line 102 as well as between the data line 104 and the power line 102, and to reduce the risk of electro-static discharge (ESD).

For example, as illustrated in FIG. 3, a first insulating layer 109 is further disposed on the base substrate 101. The active layer 116 of the driving transistor is disposed on the first insulating layer 109; a gate insulator layer 111, a gate metal layer 115 and a second insulating layer 112 are sequentially formed on the active layer 116, and a source electrode 1071 and a drain electrode 1072 are formed on the second insulating layer 112. A first via hole structure 110 is formed in the first insulating layer 109 and the second insulating layer 112, and the power line 102 is electrically connected with the source electrode 1071 of the driving transistor through the first via hole structure 110. A passivation layer 117 is formed on the source electrode 1071 and the drain electrode 1072, and a second via hole structure 118 is formed in the passivation layer 117. In this example, the dielectric layer between the first electrode 113 and the second electrode 123 of the storage capacitor as illustrated in FIG. 1 can be the second insulating layer 112.

As illustrated in FIG. 3, an OLED device 108 is disposed on the driving transistor 107, and the anode 1081 of the OLED device is electrically connected with the drain electrode 1072 through the second via hole structure 118 so as to allow the power line 102 to provide the current for the driving transistor 107 and further to provide light-emitting current for the OLED device. A pixel defining layer 1082 is formed on the anode 1081 of the OLED device, the light-emitting layer 1083 is formed on the pixel defining layer 1082, the cathode 1084 is formed on the light-emitting layer 1083, and the cathode 1084 of the OLED device is grounded.

For example, during the formation of the source electrode and the drain electrode through a patterning process, according to the material of the active layer, an etch stop layer can be further formed on the active layer if the active layer is vulnerable, which is not limited in the embodiments of the present disclosure.

For example, the power line 102 is overlapped with the active layer 116 so that the power line 102 can further function as a shielding layer, a patterning process can be saved and the production cost can be reduced.

It should be noted that each pixel defining area of the pixel defining layer corresponds to one pixel electrode and each column of sub-pixel defining areas in the pixel defining structure are of the same color in light emitting. As illustrated in FIG. 1, a sub-pixel defining area includes a white sub-pixel defining area W, a red sub-pixel defining area R, a green sub-pixel defining area G and a blue sub-pixel defining area B. Each sub-pixel defining area 101 is connected with its adjacent sub-pixel defining area 101 having the same color as itself, and each sub-pixel defining area 101 is connected with two adjacent sub-pixel defining area 101 having the same color as itself at the most.

The driving transistor and the switch transistor can both be top-gate thin-film transistors. For example, in the pixel structure, the source electrode of the switch transistor is connected with the data line, the drain electrode of the switch transistor is connected with the gate electrode of the driving transistor, and the gate electrode of the switch transistor is connected with the gate line.

The second example is that the driving transistor is a bottom-gate thin-film transistor, the power line is disposed between the gate metal layer and the base substrate, and the power line is overlapped with the active layer of the bottom-gate thin-film transistor.

Figure 4:
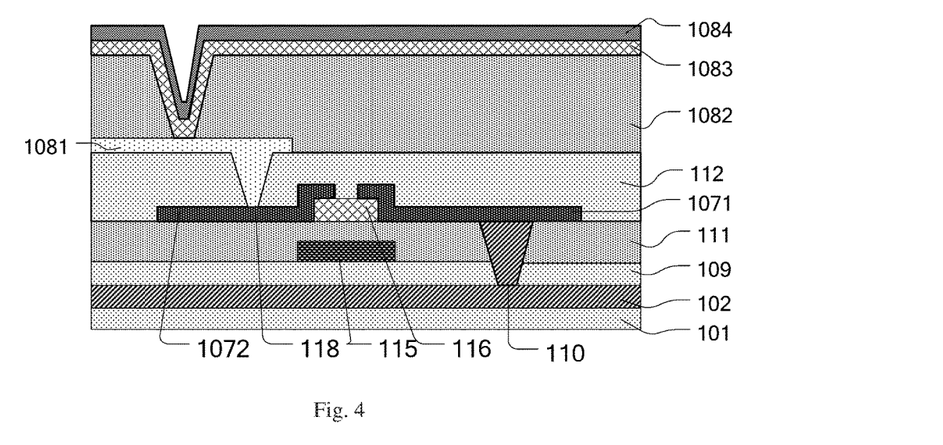
FIG. 4 is a schematic partial sectional view of another organic light-emitting diode (OLED) array substrate provided by an embodiment of the present disclosure.

For example, FIG. 4 is a schematic partial sectional view of another organic light-emitting diode (OLED) array substrate provided by an embodiment of the present disclosure. It can be seen from FIG. 1 and FIG. 4 that the power line 102, the first insulating layer 109, the switch transistor, the driving transistor and the OLED device are disposed on the base substrate 101. The first insulating layer 109 is disposed between the power line 102 and the pixel structure 105, and the power line 102 and the pixel structure 105 are at least partially overlapped. The power line 102 is far away in distance from the gate line 103 and the data line 104 so as to reduce the mutual interference between the gate line 103 and the power line 102 as well as between the data line 104 and the power line 102, and to reduce the risk of electrostatic discharge (ESD). As illustrated in FIG. 4, the first via hole structure 110 is formed in the gate insulator layer 111 and the first insulating layer 109, and the power line 102 is connected with the source 1071 of the driving transistor 107 through the first via hole structure 110. In this example, the dielectric layer between the first electrode 113 and the second electrode 123 of the storage capacitor can be the gate insulator layer 111.

For example, as illustrated in FIG. 4, the OLED device 108 is disposed on the driving transistor 107, and the OLED device 108 comprises an anode, a cathode and a light-emitting layer. The anode 1081 of the OLED device is electrically connected with the drain electrode 1072 through the second via hole structure 118 which runs through the second insulating layer 112. The pixel defining layer 1082 is formed on the anode 1081 of the OLED device, the light-emitting layer 1083 is formed in the opening area of the pixel defining layer 1082, the cathode 1084 is formed on the light-emitting layer 1083, and the cathode 1084 of the OLED device is grounded.

It should be noted that each pixel defining area of the pixel defining layer corresponds to one pixel electrode and each column of sub-pixel defining areas in the pixel defining structure are of the same color in light emitting. As illustrated in FIG. 1, a sub-pixel defining area includes a white sub-pixel defining area W, a red sub-pixel defining area R, a green sub-pixel defining area G and a blue sub-pixel defining area B. Each sub-pixel defining area 101 is connected with its adjacent sub-pixel defining area 101 having the same color as itself, and each sub-pixel defining area 101 are connected with two adjacent sub-pixel defining area 101 having the same color as itself at the most.

The driving transistor and the switch transistor can both be bottom-gate thin-film transistors. For example, in the pixel structure, the source electrode of the switch transistor is connected with the data line, the drain electrode of the switch transistor is connected with the gate electrode of the driving transistor, and the gate electrode of the switch transistor is connected with the gate line.

In the first example and the second example, the power line 102 is a planar structure made of metal mesh. The planar structure formed of metal wires (strips) intersecting with each other can help to further reduce the resistance.

For example, the base substrate 101 can be a transparent glass substrate or a transparent plastic substrate.

For example, materials of the power line 102, the gate metal layer 115, the gate 103, the source 1071, the drain 1072 and the data line 104 can be copper-based metal, such as copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb) and the like, and can also be chromium-based metal, such as chromium-molybdenum alloy (Cr/Mo), chromium-titanium alloy (Cr/Ti), chromium-molybdenum-titanium alloy (Cr/Mo/Ti) and other suitable materials.

For example, the active layer is made of a semiconductor material, which is, for example, amorphous silicon, microcrystalline silicon, polysilicon, oxide semiconductor and the like. The oxide semiconductor material can be, for example, IGZO (indium gallium zinc oxide), ZnO (zinc oxide) and the like.

For example, regions of the active layer 116 in contact with the source electrode 1071 and the drain electrode 1072 respectively can be made conductive through processes of plasma treatment and high-temperature treatment.

For example, the first insulating layer 109, the second insulating layer 112 and the pixel defining layer 1082 are usually made of organic insulating materials (e.g., acrylic resins) or inorganic insulating materials (e.g., silicon nitride SiNx or silicon oxide SiOx). For example, the first insulating layer 109 and the second insulating layer 112 can be a single-layer structure made of silicon nitride or silicon oxide, or a duel-layer structure made of silicon nitride and silicon oxide. For example, the first insulating layer 109 usually comprises two or more layers so as to reduce the parasitic capacitance between the power line 102 and metal wires in other layers.

For example, materials for forming the gate insulator layer 111 comprise silicon nitride (SiNx), silicon oxide (SiOx), aluminum oxide ($Al_2O_3$), aluminum nitride (AlN) or other suitable materials.

For example, materials for forming the passivation layer 117 comprise silicon nitride (SiNx), silicon oxide (SiOx), silicon oxynitride (SiNxOy) or acrylic resins.

For example, in the OLED device, in order to inject electrons and holes into the light-emitting layer effectively, energy barrier should be lowered. LUMO energy levels of most organic materials for OLED are in a range of 2.5 Ev~3.5 Ev, and HOMO energy levels are in a range of 5 Ev~6 Ev, so a cathode material can be a metal having a low work function, and an anode material can be a transparent material having a high work function.

For example, materials for forming the anode 1081 of the OLED device comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes and the like.

For example, materials for forming the cathode 1084 of the OLED device comprise magnesium-aluminum alloy (MgAl), lithium-aluminum alloy (LiAl) or elementary metal such as magnesium (Mg), aluminum (Al) and lithium (Li). In order to obtain a top-emission mode or a bottom-emission mode, a reflective layer can be further formed in the OLED device independently.

For example, materials for forming the light-emitting layer 1083 can be selected according to the color of emitted light. Materials for the light-emitting layer 1083 comprise fluorescent luminescent materials or phosphorescent luminescent materials. Currently, a doped system is usually adopted, that is, a dopant material doped in the matrix light-emitting material to obtain a usable light-emitting material. For example, the matrix light-emitting material can be chosen from metallic compound material, anthracene derivatives, aromatic diamine compounds, triphenylamine compounds, aromatic triamine compounds, biphenyl diamine derivatives, triarylamine polymers or the like.

For example, each column of pixel structures 105 correspond to one planar power line. In this way, the power line in each column of pixel structures is separate from another power line and the resistance between the pixel and the power line in the display area can be further reduced.

For example, in the OLED array substrate, a color film layer can be further disposed within the sub-pixel defining area. For example, the red sub-pixel, the blue sub-pixel and the green sub-pixel can be obtained by combing a white OLED device with a red color film layer, the blue color film layer and the green color film layer respectively. The color film layer can be a filter or a light converting layer (i.e., a fluorescent layer). For example, a planarization layer can be further disposed on the color film layer.

Figure 5A:
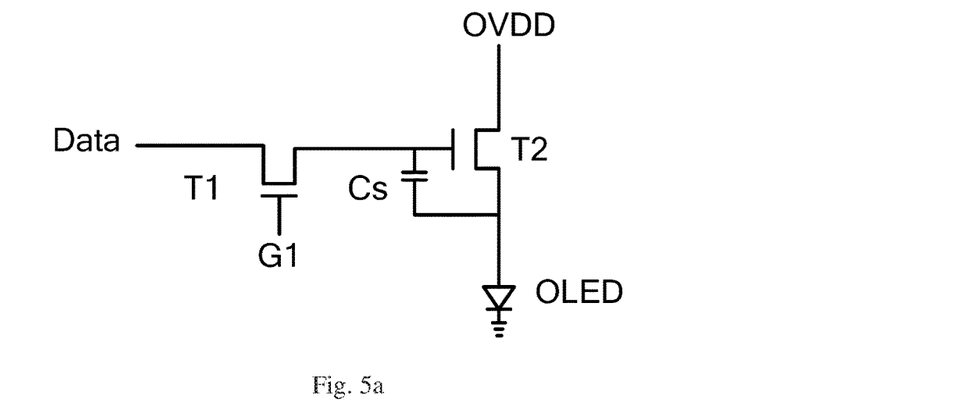
FIG. 5a is a schematic view of a 2T1C pixel circuit provided by an embodiment of the present disclosure.
Figure 5B:
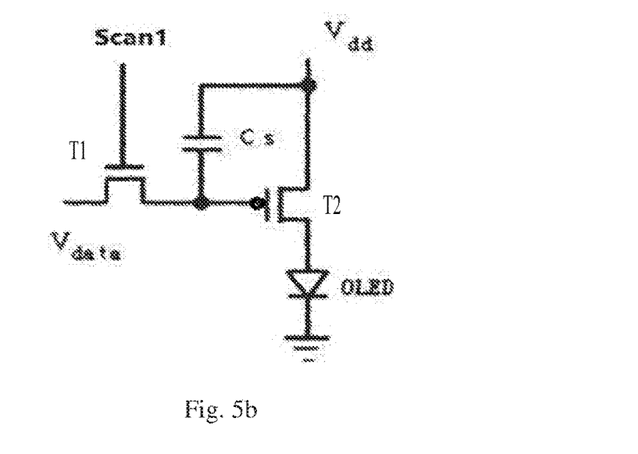
FIG. 5b is a schematic view of another 2T1C pixel circuit provided by an embodiment of the present disclosure.
Figure 5C:
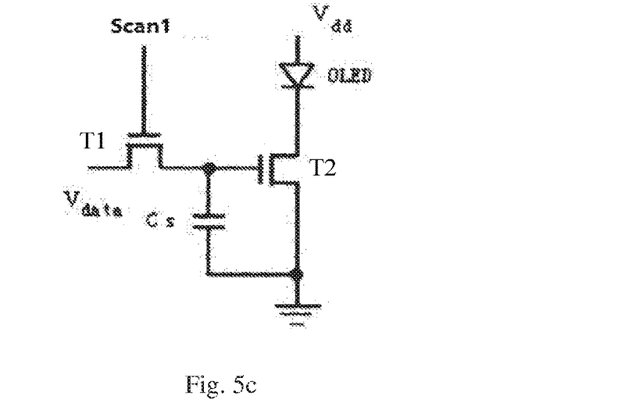
FIG. 5c is a schematic view of a further another 2T1C pixel circuit provided by an embodiment of the present disclosure.

For example, the FIGS. 5a to 5c are schematic views of 2T1C pixel circuits provided by embodiments of the present disclosure. In connection with FIG. 1 and FIG. 5a, it can be seen that besides the switch transistor T1 and the driving transistor T2, the pixel structure 105 further comprises a storage capacitor Cs. One end of the storage capacitor Cs is connected with the drain electrode of the switch transistor T1 and the gate electrode of the driving transistor T2, and the other end is connected with the drain electrode of the driving transistor T2 and the anode end of the OLED device.

As illustrated in FIG. 5b, another type of 2T1C pixel circuit comprises a switch transistor T1, a driving transistor T2 and a storage capacitor Cs. For example, of the switch transistor T1, the gate electrode is connected with a gate line (a scan line) to receive a scanning signal (Scan1); for example, the source electrode is connected with the data line to receive a data signal (Vdata), and the drain electrode is connected with the gate electrode of the driving transistor T2. Of the driving transistor T2, the source electrode is connected with a first power source terminal (Vdd, high voltage terminal), and the drain electrode is connected with the anode end of the OLED device. One end of the storage capacitor Cs is connected with the drain electrode of the switch transistor T1 and the gate electrode of the driving transistor T2, and the other end is connected with the source electrode of the driving transistor T2 and the first power source terminal. The cathode end of the OLED device is connected with a second power source terminal (Vss, low voltage terminal), and for example grounded. The driving method of the 2T1C pixel circuit is to control light and shade (gray scale) of the pixel through two TFTs and one storage capacitor Cs. When the gate line is applied with the scanning signal Scan1 to switch on the switch transistor T1, the storage capacitor Cs is charged with the data voltage (Vdata) which is input from the data line by the data driving circuit and passes through the switch transistor T1. In this way, the data voltage is stored in the storage capacitor Cs and is used to control the conduction degree of the switch transistor T1 and further control the amplitude of the current that runs through the driving transistor and drives the OLED to emit light. That is, the current determines the gray scale of the pixel. In the 2T1C pixel circuit as illustrated in FIG. 5b, the switch transistor T1 is an N-type transistor and the driving transistor is a P-type transistor.

As illustrated in FIG. 5c, another kind of 2T1C pixel circuit also comprises a switch transistor T1, a driving transistor T2 and a storage capacitor Cs, but the connection way is a little different, and the driving transistor T2 is an N-type transistor. More specifically, the differences of the pixel circuit as illustrated in FIG. 5c from the pixel circuit as illustrated in FIG. 5b lies in: the anode end of the OLED is connected with the first power source terminal (Vdd, high voltage terminal) and the cathode end of the OLED is connected with the drain electrode of the driving transistor T2. The source electrode of the driving transistor T2 is connected with the second power source terminal (Vss, low voltage terminal), and for example, grounded. One end of the storage capacitor Cs is connected with the drain electrode of the switch transistor T1 and the gate electrode of the driving transistor T2, and the other end is connected with the source electrode of the driving transistor T2 and the second power source terminal. The 2T1C pixel circuit works almost in the same way as the pixel circuit as illustrated in FIG. 1A and no description is repeated here.

Additionally, for the pixel circuits illustrated in FIG. 5b and FIG. 5c, the switch transistor T1 is not limit to an N-type transistor and can be a P-type transistor as well, and thus the polarity of the scanning signal (Scan1) controlling this switch transistor to switch on or off is modified accordingly.

For example, in the embodiment of the present disclosure, the pixel circuit can also be a 3T1C circuit, a 4T2C circuit or the like. Beside the aforesaid switch transistor and driving transistor, the pixel circuit can further comprise a compensation transistor, a reset transistor or the like, and there is no limitation in this way.

An embodiment of the present disclosure further provides a display device which comprises any one of above-mentioned organic light-emitting diode (OLED) array substrates and can further comprise a gate driving circuit, a data driving circuit and a power source. Gate lines are connected with the gate driving circuit, data lines are connected with the data driving circuit, and power lines are connected with the power source. The display device can be any product or component having display function, such as a liquid crystal panel, an e-paper, an OLED panel, a cellphone, a tablet computer, a television, a display, a laptop, a digital photo frame, a navigator or the like.

The organic light-emitting diode (OLED) array substrate comprised by the display device provided by the embodiment of the present disclosure has the same structure as the organic light-emitting diode (OLED) array substrate as illustrated in FIG. 3 or FIG. 4, and the technical effect and the implementation mechanism are the same as well, which is not repeated here.

Further, the display device can adopt a bottom emission mode or a top emission mode or a double-sided emission mode. For example, in a case that the display device comprises the OLED array substrate illustrated in FIG. 3 or FIG. 4, it can adopt a bottom emission mode.

Figure 6:
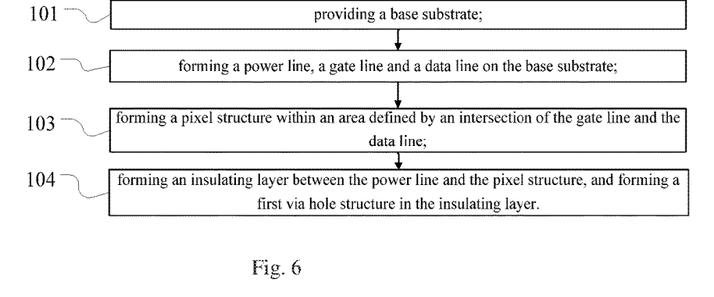
FIG. 6 is a flow chart of a manufacturing method of an organic light-emitting diode (OLED) array substrate provided by an embodiment of the present disclosure.

An embodiment of the present disclosure further provides a manufacturing method of the OLED array substrate, and FIG. 6 is a flow chart of a manufacturing method of an OLED array substrate provided by the embodiment of the present disclosure. As illustrated in FIG. 6, the manufacturing method comprises following steps:

Step 101: providing a base substrate;

Step 102: forming a power line, a gate line and a data line on the base substrate;

Step 103: forming a pixel structure within an area defined by an intersection of the gate line and the data line, wherein the pixel structure comprises a switch transistor, a drive transistor and an OLED device; and Step 104: forming an insulating layer between the power line and the pixel structure, and forming a first via hole structure in the insulating layer.

For example, as illustrated in FIG. 3, in a case that the driving transistor is a top-gate thin-film transistor, the insulating layer comprises a first insulating layer 109 and a second insulating layer 112. As illustrated in FIG. 4, in a case that the driving transistor is a bottom-gate thin-film transistor, the insulating layer comprises a gate insulator layer 111 and a first insulating layer 109.

For example, the switch transistor is connected with the gate line and the data line, and the driving transistor is connected with the switch transistor, the power line and the OLED device. The power line is disposed under the pixel structure and at least partially overlapped with the pixel structure. The power line is connected with the driving transistor through the first via hole structure.

In the manufacturing method of the OLED array substrate provided by the embodiment of the present disclosure, the power line is disposed under the pixel structure and at least partially overlapped with the pixel structure, and the power line is connected with the driving transistor through the first via hole structure, so as to prevent the power line from occupying the opening area and the capacitor area of the pixel. Therefore, the aperture ratio of the pixel area is increased and the resistance between the pixel and the OVDD in the display area is reduced.

Figure 7:
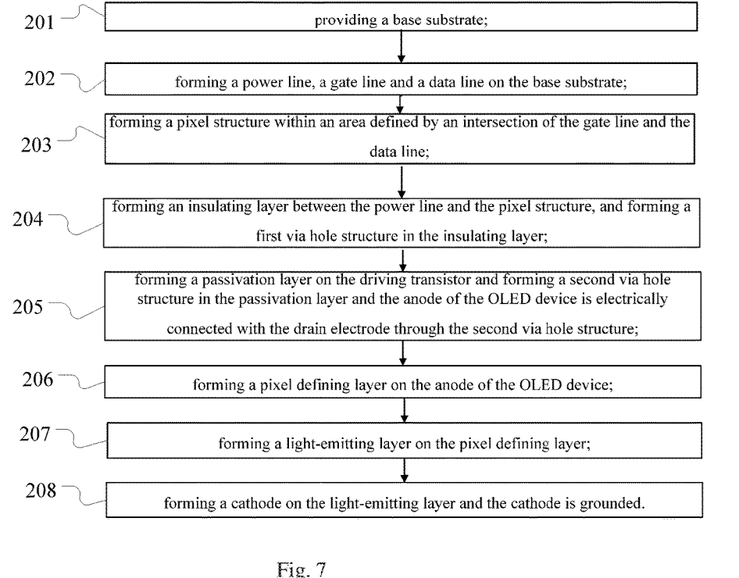
FIG. 7 is a flow chart of a manufacturing method of another organic light-emitting diode (OLED) array substrate provided by an embodiment of the present disclosure.

Descriptions about the manufacturing method of the OLED array substrate provided by the embodiment of the present disclosure are conducted by taking the driving transistor being a top-gate thin-film transistor as an example. For example, FIG. 7 is a flow chart of a manufacturing method of the OLED array substrate illustrated in FIG. 3, and the manufacturing method comprises following steps:

Step 201: providing a base substrate which can be, for example, a glass substrate, a quartz substrate and the like;

Step 202: forming a power line, a gate line and a data line on the base substrate;

Step 203: forming a pixel structure within an area defined by an intersection of the gate line and the data line, the pixel structure comprising a switch transistor, a drive transistor and an OLED device;

Step 204: forming an insulating layer between the power line and the pixel structure, and forming a first via hole structure in the insulating layer;

For example, the switch transistor is connected with the gate line and the data line, and the driving transistor is connected with the switch transistor, the power line and the OLED device. The power line is disposed under the pixel structure and at least partially overlapped with the pixel structure.

For example, as illustrated in FIG. 3, the insulating layer comprises a first insulating layer 109 and a second insulating layer 112.

For example, the driving transistor comprises an active layer, a gate insulator layer, a gate metal layer, a second insulating layer and a source-drain electrode layer (comprising a source electrode and a drain electrode) which are sequentially disposed on the first insulating layer. The first via hole structure is formed in the first insulating layer and the second insulating layer, and the power line is connected with the driving transistor through the first via hole structure.

Step 205: forming a passivation layer on the driving transistor and forming a second via hole structure in the passivation layer. The anode of the OLED device is electrically connected with the drain electrode through the second via hole structure so that the power line can provide the current for the driving transistor and further provide the light-emitting current for the OLED device.

Step 206: forming a pixel defining layer on the anode of the OLED device;

Step 207: forming a light-emitting layer on the pixel defining layer; and

Step 208: forming a cathode on the light-emitting layer and the cathode is grounded.

For example, the power line is a planar structure made of metal mesh, so that the voltage drop (IR drop) over the power line can be reduced and the power consumption of the OLED array substrate can be reduced as a result.

For example, each column of pixel structures can be disposed with a planar power line correspondingly, so that planar power lines can be connected to form an integrated structure. In this way, the area of the power line can be larger so that the voltage drop (IR drop) of the power line can be further reduced and the power consumption of the OLED array substrate can be further reduced.

For example, the power line is provided with a hollow structure within an area of the power line which corresponds to the pixel structure, the gate line and the data line. The area of the power line which corresponds to the pixel structure is formed with the hollow structure so as to prevent the metal wire from shielding light and affecting light transmittance. The area of the power line which corresponds to the gate line and the data line is formed with the hollow structure so as to avoid producing capacitance between the power line and the gate line or the data line. For example, the hollow structure 20 can comprise a plurality of disconnected hollow sub-structures 201. This means to divide the planar power line into a plurality of parallel-connected portions and can reduce the resistance of the planar power line and reduce the voltage drop of the power line to a large extent.

For example, the driving transistor is a top-gate thin-film transistor, and the power line is overlapped with the active layer of the top-gate thin-film transistor to shield the active layer from light irradiation.

For example, the driving transistor is a bottom-gate thin-film transistor, the power line is disposed between the gate metal layer and the base substrate, and the power line is overlapped with the active layer of the bottom-gate thin-film transistor.

The manufacturing method of the organic light-emitting diode (OLED) array substrate with other structure is similar and no description is repeated here.

Embodiments of the present disclosure provide an organic light-emitting diode (OLED) array substrate and a manufacturing method thereof, and a display device, which have at least one of the following beneficial effects:

(1) In the organic light-emitting diode (OLED) array substrate provided by at least one embodiment of the present disclosure, by connecting the switch transistor with the gate line and the data line, connecting the driving transistor with the switch transistor, the power line and the OLED device, setting the power line under the pixel structure and at least partially overlapped with the pixel structure, and connecting the power line with the driving transistor through the first via hole structure in the insulating layer, the OVDD line is prevented from occupying the opening area and the capacitor area of a pixel, the aperture ratio of the pixel is increased and the resistance between the pixel and the OVDD line in the display area is reduced.

(2) In the organic light-emitting diode (OLED) array substrate provided by at least one embodiment of the present disclosure, in a case that the driving transistor is a top-gate thin-film transistor, the OVDD line can function as a shielding layer, no extra space is occupied, the aperture ratio is similarly increased, and no extra process is needed.

(3) In the organic light-emitting diode (OLED) array substrate provided by at least one embodiment of the present disclosure, the first insulating layer usually comprises two or more layers so that the capacitance between the power line and the metal wire in another layer can be reduced.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined to form new embodiments.

What are described above is related to the illustrative embodiments of the disclosure only and not limitative to the scope of the disclosure; the scopes of the disclosure are defined by the accompanying claims.

The application claims priority to the Chinese patent application No. 201610848552.7, filed on Sep. 23, 2016, the entire disclosure of which is incorporated herein by reference as part of the present application.

What is claimed is:

1. An organic light-emitting diode (OLED) array substrate, comprising:
a base substrate;
a power line and a pixel structure disposed on the base substrate, wherein the power line is disposed at a side of the pixel structure close to the base substrate and is at least partially overlapped with the pixel structure; and
an insulating layer disposed between the power line and the pixel structure, wherein a first via hole structure is disposed in the insulating layer, the power line is connected with a driving transistor in the pixel structure through the first via hole structure, and the power line is directly electrically connected with a power source terminal to allow the power source terminal to provide a power voltage to the pixel structure through the power line.

2. The OLED array substrate according to claim 1, wherein the driving transistor is a top-gate thin-film transistor, and the power line is overlapped with an active layer of the top-gate thin-film transistor to shield the active layer from light irradiation.

3. The OLED array substrate according to claim 1, wherein the power line is in a planar structure made of a metal mesh.

4. The OLED array substrate according to claim 3, wherein the pixel structure is one of a plurality of pixel structures that are arranged in columns, wherein each column corresponds to one power line of the planar structure.

5. An organic light-emitting diode (OLED) array substrate comprising:
a base substrate;
a power line and a pixel structure disposed on the base substrate, wherein the power line is disposed at a side of the pixel structure close to the base substrate and is at least partially overlapped with the pixel structure;
an insulating layer disposed between the power line and the pixel structure, wherein a first via hole structure is disposed in the insulating layer, and the power line is connected with a driving transistor in the pixel structure through the first via hole structure; and
a gate line and a data line disposed on the base substrate, wherein the pixel structure is disposed within an area defined by an intersection of the gate line and the data line, and the power line is provided with a hollow structure within an area of the power line that corresponds to the pixel structure, the gate line, and the data line.

6. The OLED array substrate according to claim 5, wherein the hollow structure comprises a plurality of disconnected hollow sub-structures.

7. The OLED array substrate according to claim 1, wherein the driving transistor is a bottom-gate thin-film transistor, and the power line is disposed between a gate metal layer of the bottom-gate thin-film transistor and the base substrate.

8. A display device, comprising the organic light-emitting diode (OLED) array substrate of claim 1.

9. A manufacturing method of an organic light-emitting diode (OLED) array substrate, comprising:
providing a base substrate;
forming a power line and a pixel structure on the base substrate; and
forming an insulating layer between the power line and the pixel structure and forming a first via hole in the insulating layer,
wherein the power line is disposed at a side of the pixel structure close to the base substrate and is at least partially overlapped with the pixel structure, the power line is connected with a driving transistor in the pixel structure through the first via hole, and the power line is directly electrically connected with a power source terminal to allow the power source terminal to provide a power voltage to the pixel structure through the power line.

10. The manufacturing method according to claim 9, wherein the driving transistor is a top-gate thin-film transistor, and the power line is overlapped with an active layer of the top-gate thin-film transistor to shield the active layer from light irradiation.

11. The manufacturing method according to claim 9, wherein the power line is in a planar structure made of a metal mesh.

12. The manufacturing method according to claim 11, wherein the pixel structure is one of a plurality of pixel structures that are arranged in columns, wherein each column corresponds to one power line of the planar structure.

13. The manufacturing method according to claim 9, further comprising:
forming a gate line and a data line on the base substrate,
wherein the pixel structure is disposed within an area defined by an intersection of the gate line and the data line, and the power line is disposed with a hollow structure within an area of the power line that corresponds to the pixel structure, the gate line, and the data line.

14. The manufacturing method according to claim 13, wherein the hollow structure comprises a plurality of disconnected hollow sub-structures.

15. The manufacturing method according to claim 9, wherein the driving transistor is a bottom-gate thin-film transistor, and the power line is disposed between a gate metal layer of the bottom-gate thin-film transistor and the base substrate.

16. The OLED array substrate according to claim 1, wherein an orthographic projection of the power line on the base substrate covers an orthographic of the pixel structure on the base substrate.

17. The OLED array substrate according to claim 16, wherein the orthographic projection of the power line on the base substrate covers an orthographic of at least two pixel structures on the base substrate.

18. The OLED array substrate according to claim 17, wherein the power line is connected with the driving transistor of each of the at least two pixel structures.

19. The OLED array substrate according to claim 1, further comprising a gate line and a data line disposed on the base substrate,
wherein the pixel structure is disposed within an area defined by an intersection of the gate line and the data line, and the power line is provided with a hollow structure within an area of the power line that corresponds to the gate line and the data line.

* * * * *